United States Patent
McDonagh et al.

(10) Patent No.: US 7,046,093 B1
(45) Date of Patent: May 16, 2006

(54) DYNAMIC PHASE-LOCKED LOOP CIRCUITS AND METHODS OF OPERATION THEREOF

(75) Inventors: Declan McDonagh, Duluth, GA (US); Paul Murtagh, Duluth, GA (US)

(73) Assignee: Intergrated Device Technology, Inc., San Jose, CA (US)

( * ) Notice: Subject to any disclaimer, the term of this patent is extended or adjusted under 35 U.S.C. 154(b) by 102 days.

(21) Appl. No.: 10/649,493

(22) Filed: Aug. 27, 2003

(51) Int. Cl.
*H03L 7/00* (2006.01)

(52) U.S. Cl. .................... 331/16; 331/17; 331/34; 331/DIG. 2; 327/156; 327/157; 327/159

(58) Field of Classification Search .............. 331/16, 331/17, 34, DIG. 2; 327/156, 157, 159
See application file for complete search history.

(56) References Cited

U.S. PATENT DOCUMENTS

| | | | |
|---|---|---|---|
| 4,855,689 A | 8/1989 | Kinkel | 331/17 |
| 5,126,690 A | 6/1992 | Bui et al. | 331/1 A |
| 5,408,202 A | 4/1995 | Shirazi et al. | 331/8 |
| 5,485,490 A | 1/1996 | Leung et al. | 375/371 |
| 5,614,855 A | 3/1997 | Lee et al. | 327/158 |
| 5,626,325 A | 5/1997 | Buchanan | 251/129.14 |
| 5,942,949 A | 8/1999 | Wilson et al. | 331/17 |
| 5,973,572 A | 10/1999 | Ukita | 331/25 |
| 6,114,920 A * | 9/2000 | Moon et al. | 331/179 |
| 6,125,157 A | 9/2000 | Donnelly et al. | 375/371 |
| 6,236,697 B1 | 5/2001 | Fang | 375/376 |
| 6,252,471 B1 | 6/2001 | Salter et al. | 331/179 |
| 6,356,160 B1 | 3/2002 | Robinson et al. | 331/17 |
| 6,466,070 B1 | 10/2002 | Ross | 327/157 |
| 6,539,072 B1 | 3/2003 | Donnelly et al. | 375/371 |
| 6,583,675 B1 | 6/2003 | Gomez | 331/17 |

OTHER PUBLICATIONS

Lee et al., "A 2.5 V CMOS Delay-Locked Loop for an 18 Mbit, 500 Megabyte/s DRAM," IEEE Journal of Solid-State Circuits, vol. 29, No. 12, Dec. 1994, pp. 1491-1496.

* cited by examiner

*Primary Examiner*—Michael B Shingleton
(74) *Attorney, Agent, or Firm*—Myers Bigel Sibley & Sajovec PA

(57) ABSTRACT

A phase locked loop (PLL) circuit includes a controlled oscillator circuit that is operative to generate an output clock signal responsive to an oscillator control signal according to a plurality of selectable transfer functions, and an oscillator control signal generator circuit that is operative to generate the oscillator control signal responsive to the output clock signal and a reference clock signal. The PLL circuit further includes a transfer function control circuit operative to transition operation of the controlled oscillator from a first one of the transfer functions to a second one of the transfer functions responsive to the oscillator control signal. For example, the transfer function control circuit may step the controlled oscillator circuit through a succession of the transfer functions in response to a change in a frequency of the reference clock signal and may enable a closed loop including the oscillator control signal generator circuit and the controlled oscillator circuit upon selection of each of the succession of transfer functions.

16 Claims, 8 Drawing Sheets

DYNAMIC PHASE-LOCKED LOOP CIRCUITS AND METHODS OF OPERATION THEREOF

BACKGROUND OF THE INVENTION

The present invention relates to clock generation circuits and methods of operation thereof, and more particularly, to phase locked loop (PLL) circuits and methods of operation thereof.

PLL circuits are commonly used in clock generator circuits, such as clock buffers, that are used to generate precisely timed clock signals for distribution to various components of an electronic system. A PLL circuit typically comprises a closed loop that is used to synchronize an output clock signal with an input reference clock signal. It is generally desirable that a PLL be capable of generating an output signal that remains closely synchronized with its reference or master clock (i.e., with minimal jitter and high stability) over a range of temperatures and/or power supply voltages. It may also be desirable for the PLL to be capable of operation over a wide range of input reference clock signal frequencies.

A common issue in designing PLLs is achieving a PLL with both wide frequency range and desirable jitter suppression. For example, some conventional single-loop PLL designs that use voltage controlled oscillators (VCOs) may suffer from a disadvantageous tradeoff of loop bandwidth versus operating frequency range. In particular, as gain of the VCO is increased to increase the frequency range of the PLL, there may be a concomitant increase in susceptibility to jitter.

U.S. Pat. No. 5,942,949 to Wilson et al. describes a PLL circuit having a VCO with multiple selectable operating curves (input voltage versus output frequency transfer functions). During an auto-trim operation, a state machine applies a sequence of digital control input values to the VCO to select a succession of different operating curves until an appropriate operating curve for the present PLL application is identified. Upon identification of the appropriate operating curve, the PLL switches to normal operation using the identified operating curve. Such an approach may be disadvantageous in some applications in which it is desirable to provide dynamic operation of over a wide range of frequencies.

SUMMARY OF THE INVENTION

According to some embodiments of the present invention, a phase locked loop (PLL) circuit includes a controlled oscillator circuit that is operative to generate an output clock signal responsive to an oscillator control signal according to a plurality of selectable transfer functions. The PLL circuit also includes an oscillator control signal generator circuit (e.g., a phase/frequency detector, charge pump and loop filter) that is operative to generate the oscillator control signal responsive to the output clock signal and a reference clock signal. The PLL circuit further includes a transfer function control circuit operative to transition operation of the controlled oscillator from a first one of the transfer functions to a second one of the transfer functions responsive to the oscillator control signal. For example, the oscillator control signal may include an oscillator control voltage, and the transfer function control circuit may be operative to transition operation of the controlled oscillator circuit from the first transfer function to the second transfer function responsive to a voltage range criterion for the oscillator control voltage.

In further embodiments of the present invention, the oscillator control signal generator circuit includes a loop filter and a charge pump circuit operative to charge and discharge the loop filter responsive to the output clock signal and the reference clock signal to generate the oscillator control voltage. The transfer function control circuit is operative to enable and disable the charge pump circuit based on the voltage range criterion for the oscillator control voltage. For example, the oscillator control signal generator circuit may include a phase/frequency detector (PFD) circuit, and the transfer function control circuit may be operative to control the PFD circuit to enable and disable operation of the charge pump circuit.

In additional embodiments of the present invention, the charge pump circuit includes a first charge pump circuit, and the transfer function control circuit further includes a second charge pump circuit that controls the oscillator control voltage when the first charge pump circuit is disabled. The transfer function control circuit may be operative to disable the first charge pump based on a first voltage range criterion for the oscillator control voltage, to cause the second charge pump circuit to drive the oscillator control voltage to a voltage indicative of reduced phase/frequency error while the first charge pump is disabled, and to re-enable the first charge pump based on a second voltage range criterion for the oscillator control voltage. In still further embodiments of the present invention, the transfer function control circuit includes a window comparator circuit operative to generate a limit signal indicative of a relationship between the oscillator control voltage and a voltage window, and a transfer function selector circuit that causes the controlled oscillator to operate according to a selected transfer function responsive to the limit signal.

According to further aspects of the present invention, the transfer function control circuit is operative to step the controlled oscillator circuit through a succession of the transfer functions in response to a change in a frequency of the reference clock signal and to enable a closed loop including the oscillator control signal generator circuit and the controlled oscillator circuit upon each selection of the succession of transfer functions. The PLL circuit may further include a lock detector circuit operative to generate a lock indication signal indicative of phase agreement between the output clock signal and the reference clock signal, and the transfer function control circuit may be operative to initiate stepping of the controlled oscillator circuit through the succession of transfer functions responsive to the lock indication signal.

In other embodiments of the present invention, a PLL circuit includes a voltage-controlled oscillator (VCO) circuit that is configured to generate an output clock signal responsive to an oscillator control voltage and that is configured to provide a plurality of selectable transfer functions. The PLL circuit further includes a loop filter coupled to an oscillator control voltage input of the VCO circuit, a charge pump circuit coupled to the loop filter, and a PFD circuit that controls the charge pump responsive to the output clock signal and a reference clock signal. The PLL circuit also includes a transfer function control circuit operative to transition operation of the VCO circuit from a first one of the transfer functions to a second one of the transfer functions responsive to the oscillator control voltage.

The PLL circuit may further include a common mode feedback (CMFB) circuit operative to receive a CMFB signal from the loop filter and to responsively control a common mode voltage of the oscillator control voltage. The transfer function control circuit may be operative to transition operation of the VCO circuit from the first transfer function to the second transfer function responsive to the CMFB voltage. The transfer function control circuit may include a second charge pump circuit operative to control the CMFB voltage, a first window comparator circuit operative to disable the PFD circuit, to transition operation of the VCO circuit from the first transfer function to the second transfer function and to enable the second charge pump circuit responsive to excursion of the CMFB voltage outside a first voltage range, and a second window comparator circuit operative to cause the second charge pump circuit to drive the CMFB voltage toward a second voltage range and to re-enable the PFD circuit responsive to the CMFB voltage reaching the second voltage range. The PLL circuit may further include a lock detector circuit that generates a lock indication signal indicative of a phase agreement between the output clock signal the reference clock signal, and the first window comparator circuit may be operative to vary the first voltage range responsive to the lock indication signal.

The present invention also encompasses related methods of operating a PLL circuit.

DETAILED DESCRIPTION

Figure 1:
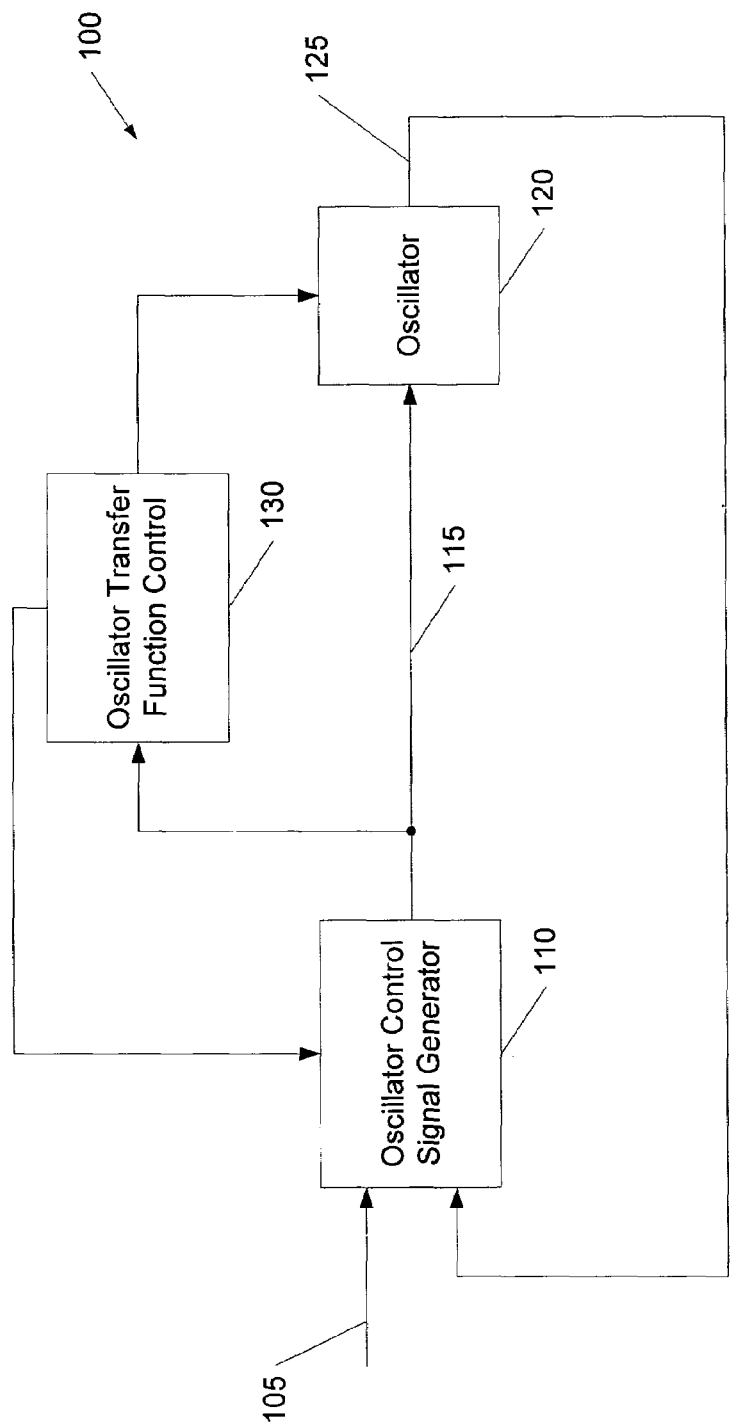
FIGS. 1–5 are a schematic diagrams illustrating PLL circuits according to various embodiments of the present invention.

Specific exemplary embodiments of the invention now will be described with reference to the accompanying drawings. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, like numbers refer to like elements. It will be understood that when an element is referred to as being "connected" or "coupled" to another element, it can be directly connected or coupled to the other element or intervening elements may be present.

FIG. 1 illustrates a PLL circuit 100 according to some embodiments of the present invention. In particular, the PLL circuit 100 includes a controlled oscillator (e.g., a voltage controlled oscillator (VCO)) 120 that is controlled by an oscillator control signal 115 generated by an oscillator control signal generator circuit 110. The oscillator control signal generator circuit 110 generates the control signal 115 responsive to a reference clock signal 105 and an output clock signal 125 produced by the controlled oscillator 120. For example, the control signal 15 may include an error signal representative of a phase and/or frequency difference between the reference clock signal 105 and the output clock signal 125 and/or some signal derived from such an error signal. The output clock signal 125 has a frequency that is responsive to the oscillator control signal 115 according to a control signal versus output frequency transfer function that is selected by an oscillator transfer function control circuit 130 responsive to the oscillator control signal 115. As further shown, the oscillator transfer function control circuit 130 is also operative to control the oscillator control signal generator circuit 110 responsive to the oscillator control signal 115 to achieve desired transition between the transfer functions of the oscillator 120.

A PLL circuit along the lines of the PLL circuit 100 of FIG. 1 may be implemented in number of different forms. It will be understood that, generally, the PLL circuit 100 may be implemented using analog circuitry, digital circuitry, or a combination of analog and digital circuitry. It will be further understood that such a PLL circuit may be implemented using multiple circuit components, e.g., discrete resistors, capacitors, logic devices, operational amplifiers and the like, or within one or more integrated circuit devices, e.g., in a clock buffer or similar integrated circuit device.

Figure 2:
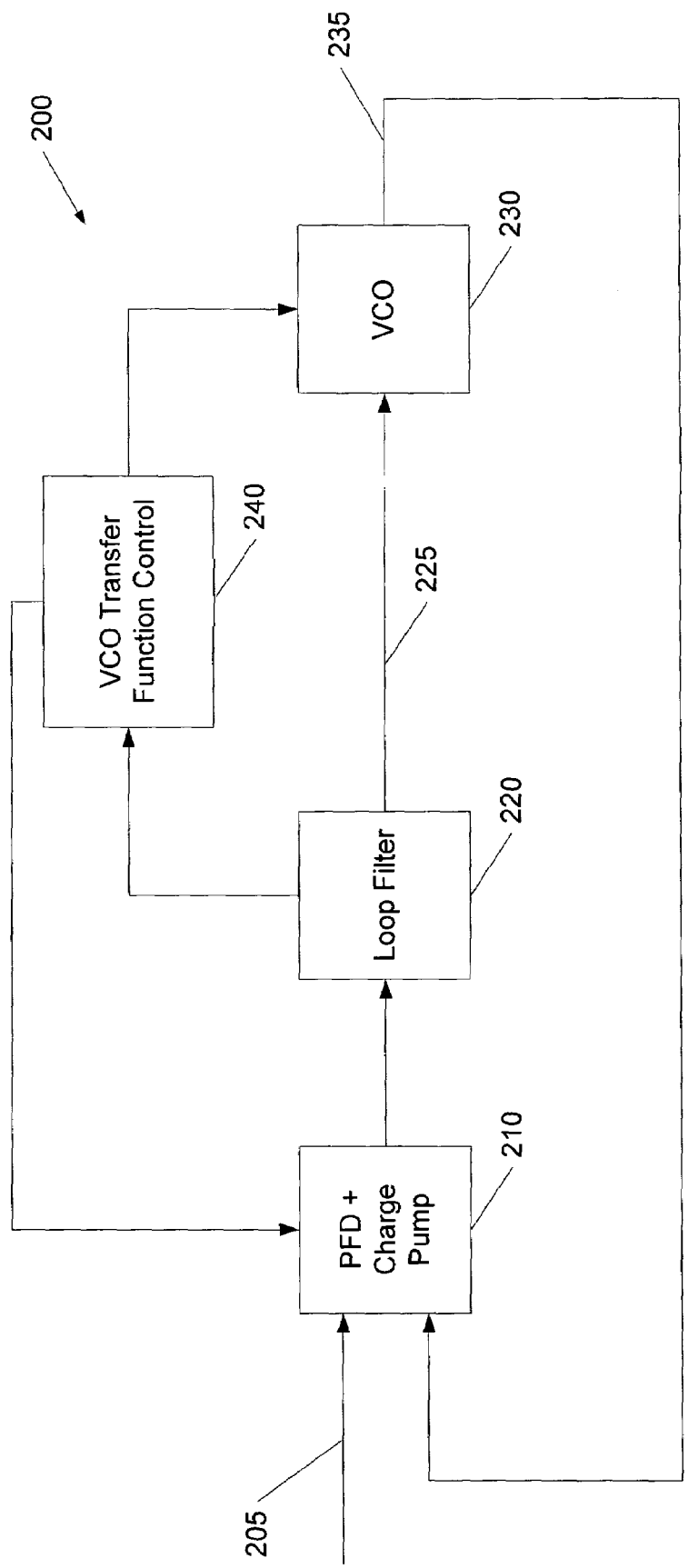

FIG. 2 illustrates a PLL circuit 200 according to further embodiments of the present invention. The PLL circuit 200 includes a VCO 230 that produces an output clock signal 235. The PLL circuit 200 further includes an oscillator control signal generator circuit including a loop filter 220 that is charged and discharged by a combination 210 of a phase/frequency detector (PFD) and charge pump responsive to a comparison of the output clock signal 235 to a reference clock signal 205. The loop filter 220 responsively produces an oscillator control voltage 225 that is applied to the VCO 230 to control the frequency of the output clock signal 235. The VCO 230 provides a plurality of selectable oscillator control voltage versus output clock frequency transfer functions. A VCO transfer function control circuit 240 selects from among the selectable transfer functions responsive to a state of the loop filter 220. For example, the VCO transfer function control circuit 240 may select a transfer function for the VCO 230 based on the oscillator control voltage 225 and/or some internal voltage, current or other state variable related thereto. The VCO transfer function control circuit 240 is also operative to control the PFD/charge pump circuit 210 responsive to the loop filter 220 to achieve desired transition between the various transfer functions of the VCO 230.

Figure 3:
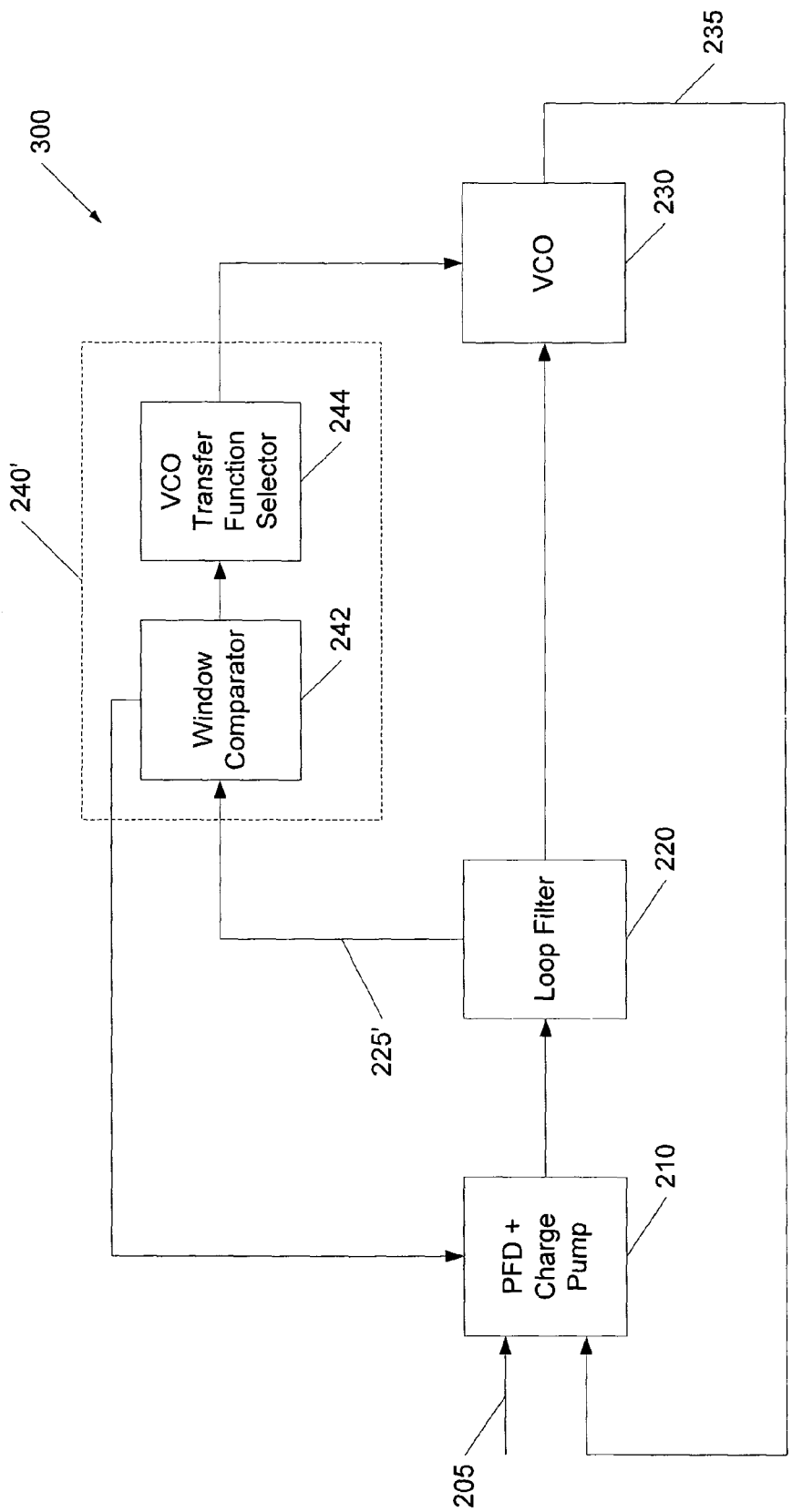

For example, referring to FIG. 3, a PLL circuit 300 according to some embodiments of the present invention may include components of FIG. 2 indicated by like reference numerals, and a VCO transfer function control circuit 240' including a window comparator circuit 242 and a VCO transfer function selector circuit 244 that is controlled by the window comparator circuit 242. In particular, the window comparator circuit 242 may be operative to detect excursions of a loop filter voltage 225' with respect to one or more predefined voltage windows, and the selector circuit 244 may cause the VCO 230 to operate according to a selected transfer function based on the state of the window comparator circuit 242. The PFD/charge pump 210 is also controlled responsive to the state of the window comparator circuit 242 to achieve appropriate transitions between transfer functions of the VCO 230.

Figure 4:
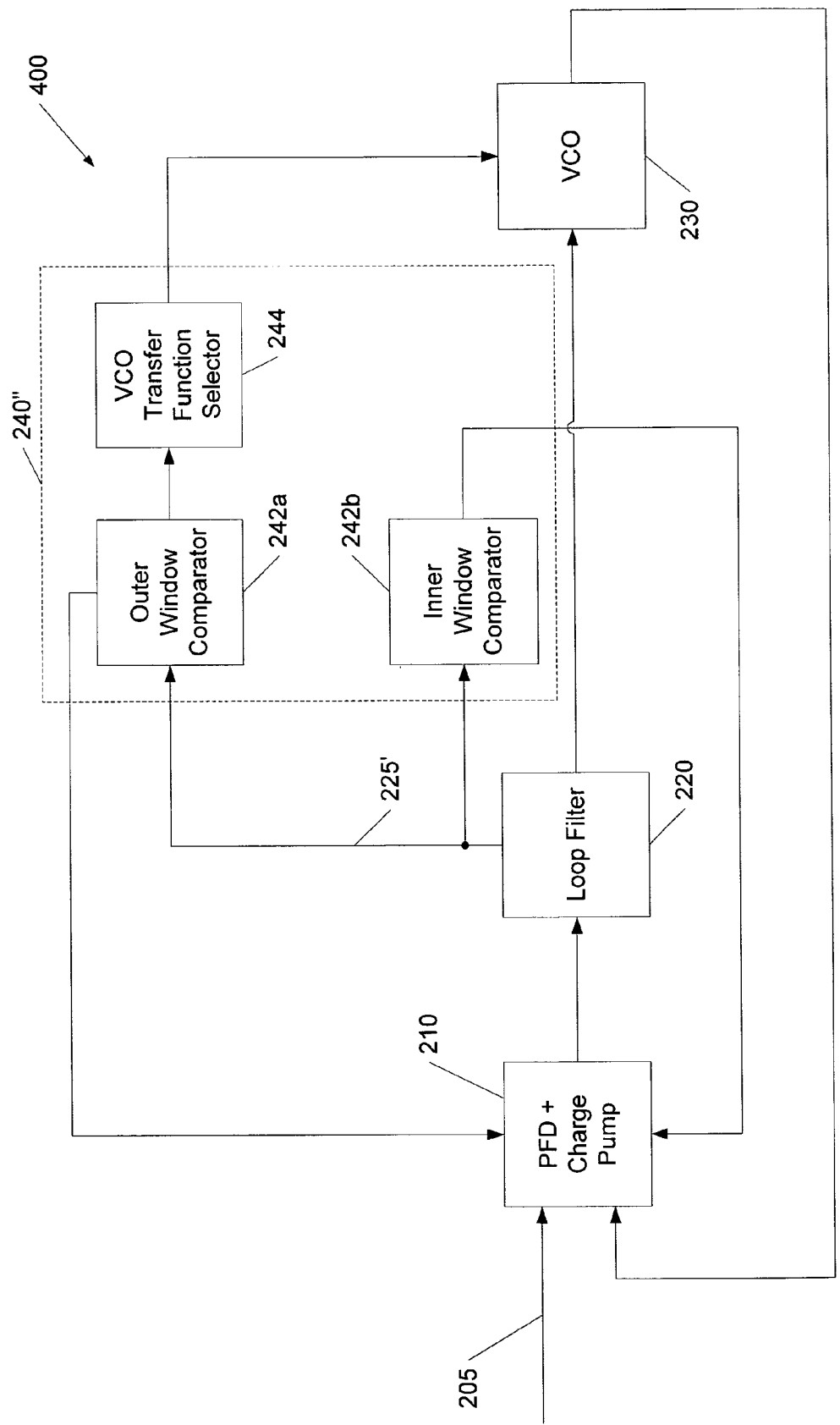

Referring to FIG. 4, a PLL circuit 400 according to still further embodiments of the present invention includes components of FIGS. 2 and 3 indicated by like reference numerals, and a VCO transfer function control circuit 240" including an outer window comparator circuit 242a and an inner window comparator circuit 242b. The outer window comparator circuit 242a controls the VCO transfer function selector circuit 244, e.g., causes the VCO transfer function selector circuit 244 to switch transfer functions of the VCO 230 responsive to detecting that the loop filter voltage 225' has reached a level indicative of a limit to the range of linearity of a transfer function current being used by the VCO 230. The outer window comparator circuit 242a is further operative to cause the PFD/charge pump circuit 210 to stop acting responsive to the reference clock signal 205 and the output clock sign 235 when such a limit is detected, which allows the inner window comparator circuit 242b to take over control of the PFD/charge pump circuit 210 to control the loop filter voltage 225' such that a graceful transition between the transfer functions can be achieved.

Figure 5:
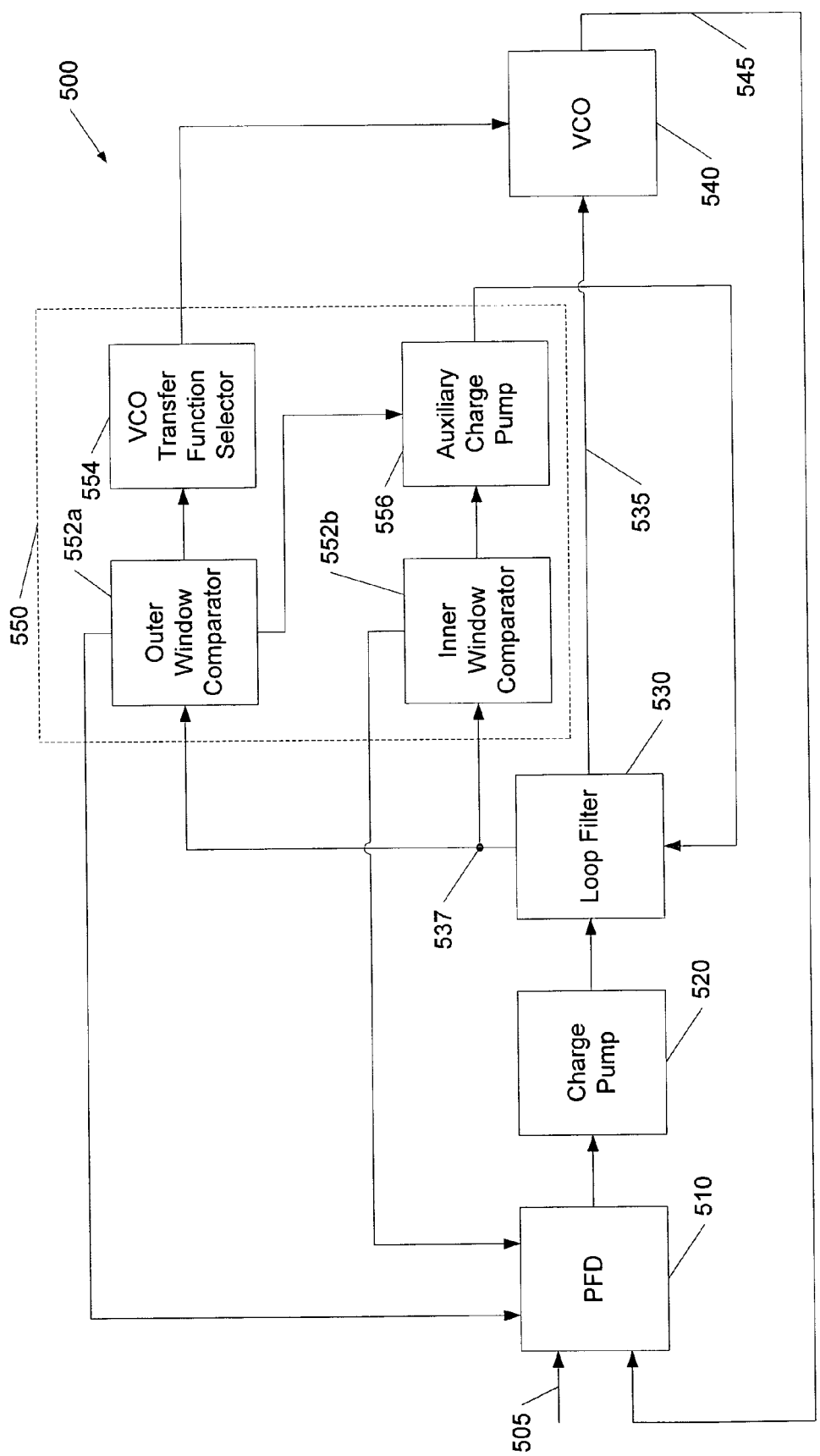

In further embodiments of the present invention illustrated in FIG. 5, a PLL circuit 500 includes a VCO 540 that produces an output clock signal 545 responsive to a VCO control voltage 535 produced by a loop filter 530. The PLL circuit 500 also includes a PFD circuit 510 that controls a charge pump 520 that charges and discharges the loop filter 530 responsive to a comparison of the output clock signal 545 and a reference clock signal 505.

The PLL circuit 500 further includes a VCO transfer function control circuit 550 that includes an outer window comparator circuit 552a, an inner window comparator circuit 552b, a VCO transfer function selector circuit 554 and an auxiliary charge pump circuit 556. The outer window comparator circuit 552a receives a loop filter voltage 537 (which may be the same as or derived from the VCO control voltage 535) produced by the loop filter 530 and responsively controls the VCO transfer function selector circuit 554 and the PFD 510. In particular, the outer window comparator circuit 552a is operative to cause the VCO transfer function selector circuit 554 to select a new transfer function for the VCO 540 responsive to determining that the loop filter voltage 537 has reached a voltage indicative of a limit (e.g., a linearity limit) for the current transfer function of the VCO 540, to concurrently disable operation of the PFD circuit 510 such that the charge pump 520 is disabled from sourcing or sinking charge to the loop filter 530, and to concurrently enable the auxiliary charge pump circuit 556 such that it drives the loop filter voltage 537 to a desired level defined by the inner window comparator circuit 552b. Upon detecting that the loop filter voltage 537 is at a desired level, the inner window comparator circuit 552 is operative to re-enable the PFD circuit 510 so that loop function can resume with the VCO operating according to the new transfer function.

Figure 6:
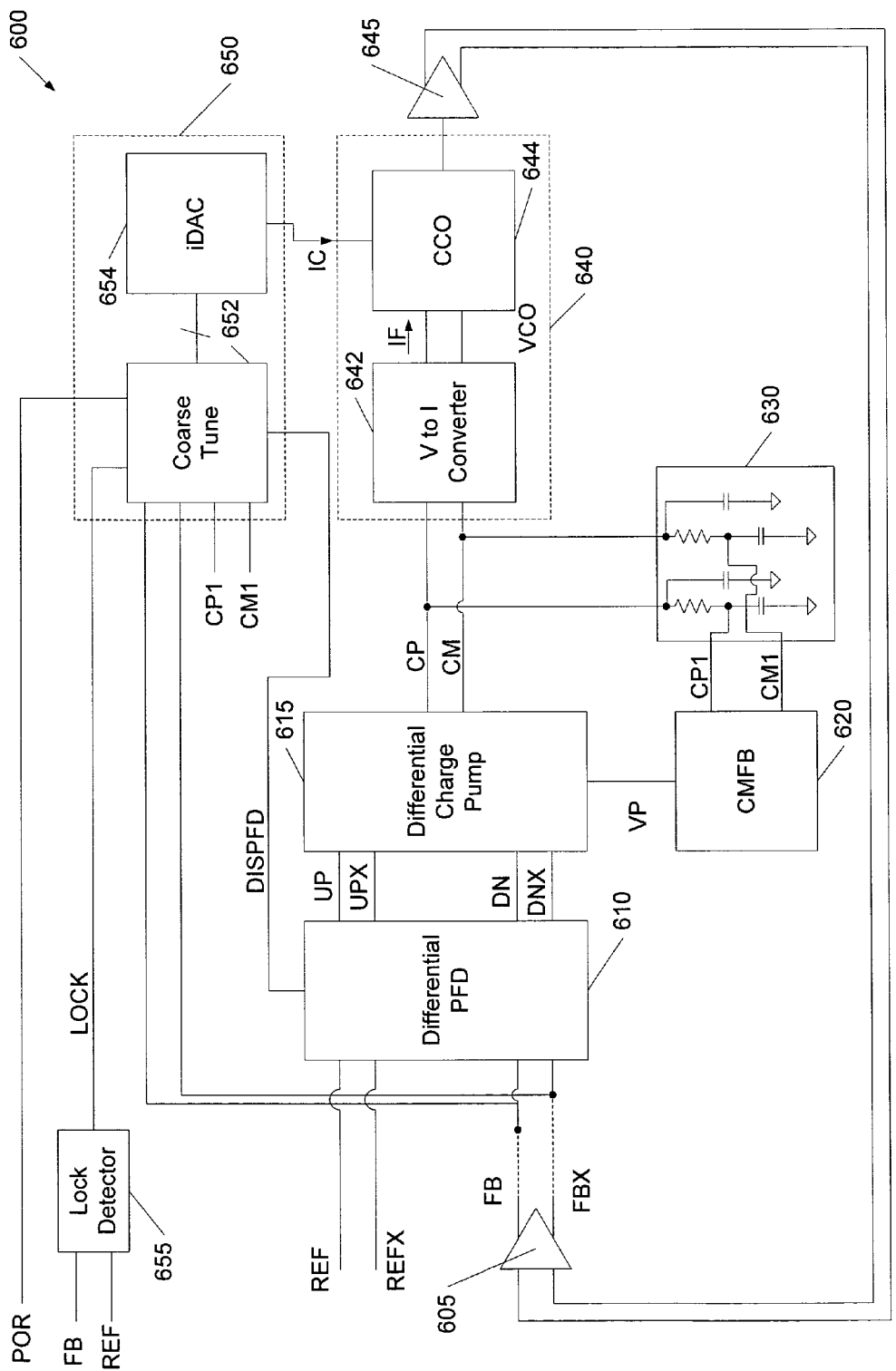
FIGS. 6 and 7 illustrate a PLL circuit and coarse tune circuit thereof, respectively, according to further embodiments of the present invention.
Figure 7:
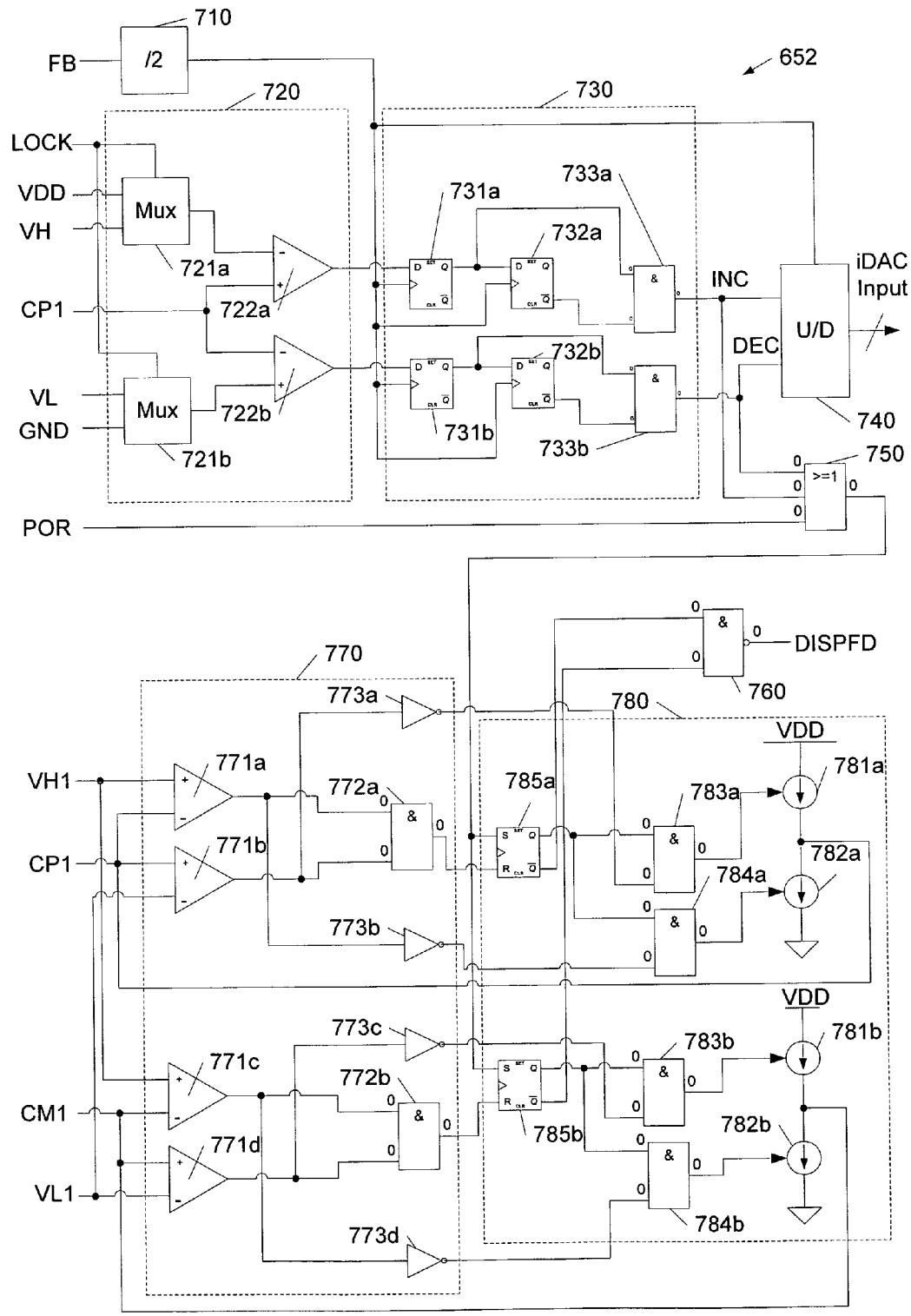

An exemplary implementation of such a PLL architecture according to some embodiments of the present invention is illustrated in FIGS. 6 and 7. Referring to FIG. 6, a PLL circuit 600 includes a differential PFD circuit 610, a differential charge pump circuit 615, a differential loop filter 630, a common mode feedback (CMFB) circuit 620, a VCO 640, and an oscillator transfer function control circuit 650. The PFD circuit 610 generates differential charge pump command signals UP/UPX, DN/DNX responsive to comparison of a differential reference clock signal REF/REFX and a differential feedback clock signal FB/FBX produced by the VCO 640 via output and input buffers 645, 605. The charge pump circuit 615 responsively charges the loop filter 630 to produce a differential pair of VCO control voltages CP, CM, a common mode voltage of which is controlled by the CMFB circuit 620 that generates a control signal VP for the charge pump 615 responsive to a different pair of CMFB voltages CP1, CM1 produced by the loop filter 630. It will be appreciated that the CMFB voltages CP1, CM1 are responsive to (i.e., are filtered representations of) the VCO control voltages CP, CM.

The VCO 640 includes a voltage to current (V to I) converter circuit 642 and a current controlled oscillator (CCO) 644. The converter circuit 642 produces a control current IF for the CCO 644 responsive to the VCO control voltages CP, CM. The CCO 644 is configured to provide a plurality of selectable current versus output frequency transfer functions, which are selectable responsive to a current IC.

The oscillator transfer function control circuit 650 includes a current-type digital to analog converter circuit (iDAC) 654 that produces the control current IC responsive to a multi-bit digital signal produced by a coarse tuning circuit 652. The coarse tuning circuit 652 controls the iDAC 654 responsive to the CMFB voltages CP1, CM1 produced by the loop filter 630, the feedback clock signal FB/FBX, a lock indication signal LOCK produced by a lock detector circuit 655, and a power on reset signal POR. The coarse tuning circuit 652 is also operative to control the CMFB voltages CP1, CM1 and to generate a PFD disable signal DISPFD that controls operation of the PFD circuit 610.

Internal components of the coarse tuning circuit 652 are illustrated in FIG. 7. In particular, the coarse tuning circuit 652 includes an outer window comparator circuit 720 including multiplexers 721a, 721b and comparators 722a, 722b. The muxes 721a, 721b are operative to compare the CMFB voltage CP1 to a selected one of outer voltage limit pairs VH, VL or VDD, GND based on the state of the lock indication signal LOCK. The coarse tuning circuit 652 further includes a pulse generator circuit 730 coupled to the window comparator circuit 720 and a divide by 2 counter 710 that receives the feedback clock signal FB/FBX. The pulse generator circuit 730 is operative to produce pulse signals INC, DEC responsive to voltage comparisons made by the outer window comparator circuit 720. The pulse generator circuit 730 includes D-type flip-flops 731a, 731b, 732a, 732b and AND gates 733a, 733b. The pulse signals INC, DEC control operation of a counter 740 that produces the multi-bit input to the iDAC 654 of FIG. 6, and are also fed to a OR gate 750 that is operative to enable and disable an auxiliary charge pump circuit 780. The OR gate 750 also receives the power on reset signal POR.

The auxiliary charge pump circuit 780 includes current sources 781a, 781b, 782a, 782b that are controlled by logic circuitry including AND gates 783a, 783b, 784a, 784b and S-R flip-flops 785a, 785b. The auxiliary charge pump circuit 780 is enabled responsive to setting of the flip-flops 785a, 785b, which are also configured to generate the PFD disable signal DISPFD via a NAND gate 760. When the auxiliary charge pump circuit 780 is enabled, the current sources 781a, 781b, 782a, 782b are controlled by an inner window comparator circuit 770, which includes voltage comparators 771a, 771b, 771c, 771d, AND gates 772a, 772b, and inverters 773a, 773b, 773c, 773d.

Figure 8A:
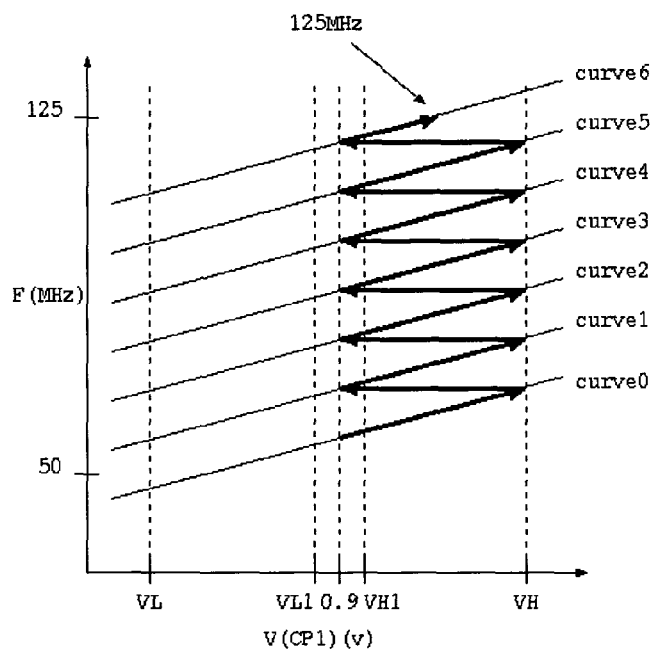
FIGS. 8A and 8B are common-mode feedback voltage versus frequency graphs illustrating exemplary operations of the PLL circuit of FIGS. 6 and 7.
Figure 8B:
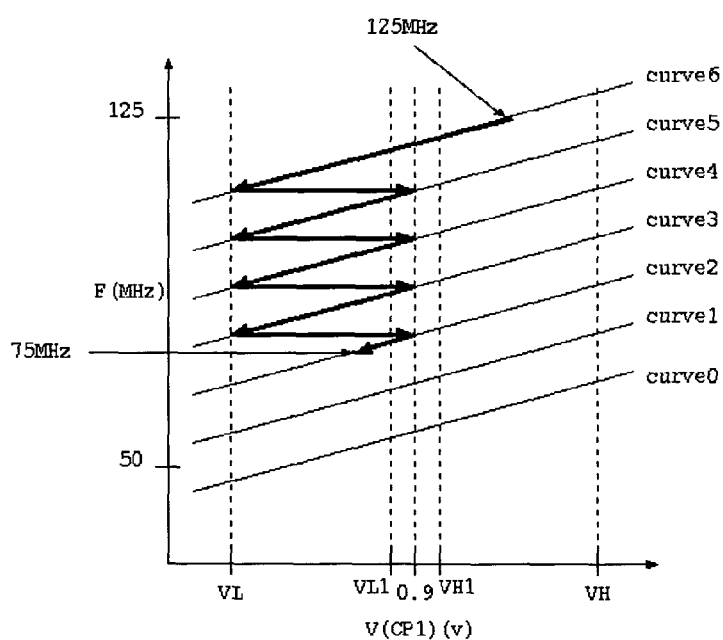

Exemplary operation of the PLL circuitry of FIGS. 6 and 7 will now be described with reference to the graphs shown in FIGS. 8a and 8b. Upon power up, the counter 740 is set to "0" and iDAC 654 produces a current IC that causes the CCO 644 to operate on curve 0. If a reference clock signal REF/REFX of around 125 MHz applied, the CMFB voltages CP1, CM 1 are initially at around zero volts and the lock indication signal LOCK signal is "low," indicating an out of lock condition. In response to assertion of the power on reset signal POR to a logic "high" upon power up, the MIDSET signal produced by the OR gate 750 goes "high." This sets the S-R flip-flops 785a, 785b and drives the DISPFD signal "high," thus disabling the PFD circuit 610.

The inner window comparator circuit 770 begins to charge the common mode voltage nodes CP1, CM1 by turning on positive current sources 781a, 781b. Upon the common mode voltages CP1, CM1 reaching the window defined by the voltages VH1, VL1 (in the given example, voltages slightly above and slightly below 0.9 volts, respectively), the current sources 781a, 781b turn off and the S-R flip-flops 785a, 785b are reset. This causes the DISPFD signal to go "low," which enables the PFD circuit 610 and initiates operation of the PLL loop.

At this stage, the frequency produced by the CCO 644 is still below that of the reference clock REF/REFX. Accordingly, the CMFB voltages CM1, CP1 diverge such that the voltage CP1 eventually exceeds the threshold voltage VH of the outer window comparator circuit 720. This causes generation of an INC pulse by the pulse generation circuit 730, which increments the counter 740 and drives the MIDSET signal "high." In response, the PFD circuit 610 is disabled and the auxiliary current pump circuit 780 is enabled. Upon enabling of the auxiliary charge pump circuit 780, current sources 782a, 781b are turned on by the inner window comparator circuit 770, thus driving the CMFB voltages CP1, CM1 back towards the window defined by the voltages VH1, VL1. When the CMFB voltages CP1, CM1 reach this window, the auxiliary current pump circuit 780 is again disabled by the resetting of the flip-flops 785a, 785b, which also re-enables the PFD circuit 610 by sending the DISPFD signal "low." The end result is that PLL loop is again enabled, this time with the CCO 644 operating on curve 1. Transitions through curves 2–6 occur as shown in FIG. 8A by similarly incrementing the counter 740 responsive to the CMFB voltages CP1, CM 1, such that the CCO ends up reaching the 125 MHz operating point on curve 6. At this point, the lock indication signal LOCK goes "high," which causes the muxes 721a, 721b to change from the voltage limit pair VH, VL to a wider voltage limit pair VDD, GND. This can help increase immunity to loss of lock if temperature or VDD drift subsequently occurs.

The circuit of FIGS. 6 and 7 can also provide desirable performance when the reference clock signal REF/REFX exhibits a step change in frequency, an occurrence that may correspond, for example, to a change in operating mode of an electronic device employing the PLL circuit 600. For example, referring to FIG. 8b, if the reference clock frequency changes from 125 MHz to 75 MHz, the lock indication signal LOCK goes "low," indicating a loss of phase/frequency clock. In response, the muxes 721a, 721b change from the voltage limit pair VDD, GND back to the voltage limit pair VH, VL. The operation of the PFD circuit 610 and the charge pump 615 then drives the CMFB voltage CP1 below the voltage limit VL, generating a DEC pulse that decrements the counter 740, which, in turn, causes the CCO 644 to transition from operating curve 6 to curve 5.

The DEC pulse also sets the S-R flip-flops 785a, 785b, which causes the DISPFD signal to disable the PFD circuit 610 and which enables the auxiliary charge pump circuit 780. The inner window comparator circuit 770 turns on the positive current source 781a to increase the CMFB voltage CP1 and turns on the negative current source 782b to decrease the CMFB voltage CM1. When both of the CMFB voltages CP1, CM1 reach the window defined by the voltage VH1, VL1, the S-R flip-flops 785a, 785b are reset, which again sends the PFD disable signal DISPFD "low," thus reactivating the PFD circuit 610 and enabling the loop to resume operation with the CCO 644 operating on curve 5. Operation of the PFD circuit 610 and the charge pump 612 again drives the CMFB voltage CP1 below the voltage limit VH, which again causes the counter 740 to decrement, the CCO 644 to start operating on curve 4, and the PFD circuit 610 to be disabled while the CMFB voltages CP1, CM 1 are again driven within the window defined by the inner voltage limits VH1, VL1. These frequency-reduction operations repeat until the counter 740 decrements to a count corresponding to operation of the CCO 644 on curve 2, which encompasses operation at 75 MHz. At this point, phase/frequency lock occurs, which causes assertion of the lock indication signal LOCK and changing of the voltage limits of the outer window comparator circuit 720 to VDD and GND. It will be appreciated that comparable process occurs in response to a step increase in the frequency of the reference clock signal REF/REFX.

It will be appreciated that the circuitry illustrated in FIGS. 6 and 7 represents an exemplary implementation according to some embodiments of the present invention, and that other implementations also fall within the scope of the present invention. For example, a variety of different analog and/or digital logic circuits may be used to provide the functionality described, and fall within the scope of the present invention.

In the drawings and specification, there have been disclosed exemplary embodiments of the invention. Although specific terms are employed, they are used in a generic and descriptive sense only and not for purposes of limitation, the scope of the invention being defined by the following claims.

What is claimed is:

1. A phase locked loop (PLL) circuit, comprising:
a controlled oscillator circuit operative to generate an output clock signal responsive to an oscillator control voltage according to a plurality of selectable transfer functions;
an oscillator control signal generator circuit that generates the oscillator control signal responsive to the output clock signal and a reference clock signal, wherein the oscillator control signal generator circuit comprises:
a loop filter; and
a charge pump circuit operative to charge and discharge the loop filter responsive to the output clock signal and the reference clock signal to generate the oscillator control voltage;
a transfer function control circuit operative to transition operation of the controlled oscillator circuit from a first one of the transfer functions to a second one of the transfer functions responsive to the oscillator control voltage, wherein the transfer function control circuit is operative to transition operation of the controlled oscillator circuit from the first transfer function to the second transfer function responsive to a voltage range criterion for the oscillator control voltage and wherein the transfer function control circuit is operative to enable and disable the charge pump circuit based on the voltage range criterion for the oscillator control voltage.

2. A PLL circuit according to claim 1, wherein the oscillator control signal generator circuit further comprises a phase/frequency detector (PFD) circuit, and wherein the transfer function control circuit is operative to control the PFD circuit to enable and disable operation of the charge pump circuit.

3. A PLL circuit according to claim 1, wherein the charge pump circuit comprises a first charge pump circuit, and wherein transfer function control circuit further comprises a second charge pump circuit that controls the oscillator control voltage when the first charge pump circuit is disabled.

4. A PLL circuit according to claim 3, wherein the transfer function control circuit is operative to disable the first charge pump based on a first voltage range criterion for the oscillator control voltage, to cause the second charge pump circuit to drive the oscillator control voltage to a voltage indicative of reduced phase/frequency error while the first charge pump is disabled, and to re-enable the first charge pump based on a second voltage range criterion for the oscillator control voltage.

5. A PLL circuit according to claim 1, wherein the transfer function control circuit comprises:
   a window comparator circuit operative to generate a limit signal indicative of a relationship between the oscillator control voltage and a voltage window; and
   a transfer function selector circuit that causes the controlled oscillator to operate according to a selected transfer function responsive to the limit signal.

6. A PLL circuit according to claim 1, wherein the transfer function control circuit is operative to step the controlled oscillator circuit through a succession of the transfer functions in response to a change in a frequency of the reference clock signal and to enable a closed loop including the oscillator control signal generator circuit and the controlled oscillator circuit upon each selection of the succession of transfer functions.

7. A PLL circuit according to claim 6, further comprising a lock detector circuit operative to generate a lock indication signal indicative of phase agreement between the output clock signal and the reference clock signal, and wherein the transfer function control circuit is operative to initiate stepping of the controlled oscillator circuit through the succession of transfer functions responsive to the lock indication signal.

8. A PLL circuit, comprising:
   a voltage-controlled oscillator (VCO) circuit that is configured to generate an output clock signal responsive to an oscillator control voltage according to a plurality of selectable transfer functions;
   a loop filter coupled to an oscillator control voltage input of the VCO circuit;
   a charge pump circuit coupled to the loop filter;
   a PFD circuit that controls the charge pump responsive to the output clock signal and a reference clock signal;
   a transfer function control circuit operative to transition operation of the VCO circuit from a first one of the transfer functions to a second one of the transfer functions responsive to the oscillator control voltage; and
   a common mode feedback (CMFB) circuit operative to receive a CMFB signal from the loop filter and to responsively control a common mode voltage of the oscillator control voltage, and wherein the transfer function control circuit is operative to transition operation of the VCO circuit from the first transfer function to the second transfer function responsive to the common mode voltage.

9. A PLL circuit according to claim 8, wherein the charge pump circuit comprises a first charge pump circuit, and wherein the transfer function control circuit comprises:
   a second charge pump circuit operative to control the CMFB voltage;
   a first window comparator circuit operative to disable the PFD circuit, to transition operation of the VCO circuit from the first transfer function to the second transfer function and to enable the second charge pump circuit responsive to excursion of the CMFB voltage outside a first voltage range; and
   a second window comparator circuit operative to cause the second charge pump circuit to drive the CMFB voltage toward a second voltage range and to re-enable the PFD circuit responsive to the CMFB voltage reaching the second voltage range.

10. A PLL circuit according to claim 9, further comprising a lock detector circuit that generates a lock indication signal indicative of a phase agreement between the output clock signal the reference clock signal, and wherein the first window comparator circuit is operative to vary the first voltage range responsive to the lock indication signal.

11. A PLL circuit according to claim 8, wherein the transfer function control circuit is operative to step the VCO circuit through a succession of the transfer functions in response to a change in a frequency of the reference clock signal and to enable a closed loop including the PFD circuit, the charge pump and the VCO circuit upon selection of each of the succession of transfer functions.

12. A PLL circuit according to claim 11, further comprising a lock detector circuit operative to generate a lock indication signal indicative of phase agreement between the output clock signal and the reference clock signal, and wherein the transfer function control circuit is operative to initiate stepping of the VCO circuit through the succession of transfer functions responsive to the lock indication signal.

13. A method of operating a PLL circuit including a controlled oscillator that produces an output clock signal having a frequency that varies according to an oscillator control voltage wherein the PLL circuit comprises a loop filter and a charge pump circuit operative to charge and discharge the loop filter responsive to the output clock signal and a reference clock signal to generate the oscillator control voltage, the method comprising:
   transitioning operation of the controlled oscillator from a first transfer function to a second transfer function responsive to the oscillator control voltage, wherein transitioning operation of the controlled oscillator circuit from the first transfer function to the second transfer function responsive to the oscillator control voltage comprises enabling and disabling the charge pump circuit based on the voltage range criterion for the oscillator control voltage.

14. A method according to claim 13, wherein the PLL circuit further comprises a phase/frequency detector (PFD) circuit, and wherein enabling and disabling the charge pump circuit based on the voltage range criterion for the oscillator control voltage comprises controlling the PFD circuit responsive to the voltage range criterion to enable and disable operation of the charge pump circuit.

15. A method according to claim 13, further comprising driving the oscillator control voltage to a voltage indicative of reduced phase/frequency error while the charge pump is disabled, and then re-enabling the charge pump based on a second voltage range criterion for the oscillator control voltage.

16. A method according to claim 13, comprising:
   stepping the controlled oscillator through a succession of the transfer functions in response to a change in a frequency of the reference clock signal; and
   enabling a closed loop including the controlled oscillator circuit upon selection of each of the succession of transfer functions.

* * * * *